(12) United States Patent
Teboulle

(10) Patent No.: US 11,199,567 B2
(45) Date of Patent: Dec. 14, 2021

(54) METHOD FOR DETECTING A SAG IN A PHASE VOLTAGE OF AN ELECTRICAL NETWORK

(71) Applicant: SAGEMCOM ENERGY & TELECOM SAS, Rueil Malmaison (FR)

(72) Inventor: Henri Teboulle, Rueil Malmaison (FR)

(73) Assignee: SAGEMCOM ENERGY & TELECOM SAS, Rueil Malmaison (FR)

( * ) Notice: Subject to any disclaimer, the term of this patent is extended or adjusted under 35 U.S.C. 154(b) by 162 days.

(21) Appl. No.: 16/608,107

(22) PCT Filed: Apr. 16, 2018

(86) PCT No.: PCT/EP2018/059696
§ 371 (c)(1),
(2) Date: Oct. 24, 2019

(87) PCT Pub. No.: WO2018/197252
PCT Pub. Date: Nov. 1, 2018

(65) Prior Publication Data
US 2020/0249261 A1 Aug. 6, 2020

(30) Foreign Application Priority Data
Apr. 26, 2017 (FR) ...................................... 1753646

(51) Int. Cl.
*G01R 21/133* (2006.01)
*G01R 19/25* (2006.01)
(Continued)

(52) U.S. Cl.
CPC ....... *G01R 21/133* (2013.01); *G01R 19/2513* (2013.01); *G01R 21/1333* (2013.01);
(Continued)

(58) Field of Classification Search
CPC .............. G01R 21/133; G01R 21/1333; G01R 19/2513; G01R 31/50; H02H 3/04; H02H 3/38
See application file for complete search history.

(56) References Cited

U.S. PATENT DOCUMENTS 9,797,935 B2 * 10/2017 Airaksinen .......... G01R 22/068
2001/0013771 A1 * 8/2001 Wasmer ................ G01R 19/155
324/86
(Continued)

FOREIGN PATENT DOCUMENTS

| CN | 102623269 A | 8/2012 |
| EP | 1187293 A2 | 3/2002 |

(Continued)

*Primary Examiner* — Bryan Bui
(74) *Attorney, Agent, or Firm* — Muncy, Geissler, Olds & Lowe, P.C.

(57) ABSTRACT

Method for detecting a sag in a phase voltage, including the steps of: measuring, upstream of a switching member and at regular intervals, the phase voltage and a phase current flowing through a phase conductor; when the phase voltage falls below a predetermined voltage threshold, opening the switching member; subsequent to opening the switching member, if the phase voltage returns to a normal voltage value defined according to the phase current, detecting a malfunction of the electricity meter, generating a warning message, and keeping the switching member open; subsequent to opening the switching member, if the phase voltage remains below the predetermined voltage threshold, detecting a sag in the phase voltage, generating an alert message, and closing the switching member.

10 Claims, 3 Drawing Sheets

(51) Int. Cl.
　　　*H02H 3/04*　　　(2006.01)
　　　*H02H 3/38*　　　(2006.01)
　　　*G01R 31/50*　　(2020.01)

(52) U.S. Cl.
　　　CPC ............... *G01R 31/50* (2020.01); *H02H 3/04* (2013.01); *H02H 3/38* (2013.01)

(56) References Cited

U.S. PATENT DOCUMENTS

| | | |
|---|---|---|
| 2012/0033338 A1 | 2/2012 | Van Leeuwen |
| 2015/0077891 A1 | 3/2015 | Edwards |
| 2015/0276830 A1 | 10/2015 | Airaksinen |

FOREIGN PATENT DOCUMENTS

| | | |
|---|---|---|
| EP | 1193854 A1 | 4/2002 |
| EP | 2448087 A1 | 5/2012 |
| FR | 2585158 A1 | 1/1987 |
| FR | 2749084 A1 | 11/1997 |

\* cited by examiner

METHOD FOR DETECTING A SAG IN A PHASE VOLTAGE OF AN ELECTRICAL NETWORK

The invention relates to managing electricity networks, and more particularly to the field of methods of detecting a phase voltage sag in an electricity network.

BACKGROUND OF THE INVENTION

Numerous reasons may lead to a voltage sagging in an electricity network that distributes electrical energy to electrical installations.

Among these reasons, mention may be made of excessive electricity consumption by the electrical installations. Mention may also be made of a stoppage of an electricity production unit, such as a hydroelectric power station or a nuclear power station, due to maintenance operations, to a failure of any kind, or to unfavorable weather conditions.

The voltage of the electricity network does not necessarily sag in uniform manner over the entire electricity network. In general, the electrical installations that are the furthest from those production units that are still in operation are the installations that are the most affected.

A voltage sag can have consequences that are quite considerable, both in an electrical installation (degraded operation of electrical installation, failure) and also in the electricity network itself (voltage collapse due to a plurality of electricity production units being stopped in cascade).

A sag in the voltage of the electricity network can be detected by an electricity meter measuring the electrical energy delivered to an electrical installation by the electricity network.

Nevertheless, it is appropriate to ensure that the voltage sag detected by the electricity meter does not stem from the electricity meter itself. Specifically, it is possible for an electricity meter itself to give rise to a local voltage drop. Among the causes associated with the meter that can lead to a local voltage drop, there is "blackening" of a cut-off member in the meter. Certain meters include a cut-off member that enables action to be taken remotely to connect together or to disconnect the electrical installation and the electricity network. The contacts of the cut-off member may be subjected to electric arcs that produce deposits of carbon on the contacts of the cut-off member. This phenomenon is referred to as "blackening". Blackening tends to increase the resistance of the cut-off member when it is closed. Typically, the cut-off member presents an increase in resistance having an order of magnitude that is expressed in milliohms (mΩ). However, the current conveyed by the cut-off member may be very large, and may typically reach the value of 140 amps (A). Thus, the increase in the resistance of the cut-off member can cause the voltage to drop quite considerably across the electricity meter.

OBJECT OF THE INVENTION

An object of the invention is to enable an electricity meter to detect a sag in a phase voltage of an electricity network, while ensuring that the sag does not stem from the electricity meter itself.

SUMMARY OF THE INVENTION

In order to achieve this object, there is provided a detection method for detecting a sag of a phase voltage present on a phase line of an electricity network, the detection method being performed by an electricity meter that is connected to the electricity network and that includes a cut-off member inserted in a phase conductor connected to the phase line, the detection method comprising the following steps:

measuring, upstream from the cut-off member and at regular intervals, the phase voltage and a phase current conveyed by the phase conductor;

when the phase voltage becomes less than a predetermined voltage threshold, opening the cut-off member;

after opening the cut-off member, if the phase voltage returns to a normal voltage value defined as a function of the phase current, detecting a malfunction of the electricity meter, generating an alarm message to inform about the malfunction of the electricity meter, and keeping the cut-off member open;

after opening the cut-off member, if the phase voltage remains less than the predetermined voltage threshold, detecting a sag of the phase voltage, generating a warning message informing about the sag of the phase voltage, and re-closing the cut-off member.

The detection method thus makes it possible not only to detect a sag of the phase voltage, but also to ensure that the sag of the phase voltage as detected does indeed stem from the electricity network and not from a malfunction of the electricity meter itself.

There is also provided an electricity meter including a cut-off member, a voltage sensor, a current sensor, a memory, and a processor component arranged to perform of the above-described detection method.

There is also provided a computer program including instructions for enabling an electricity meter to perform the above-described detection method.

There are also provided storage means, characterized in that they store a computer program including instructions for enabling an electricity meter to perform the above-described detection method.

Other characteristics and advantages of the invention appear on reading the following description of particular, nonlimiting embodiments of the invention.

BRIEF DESCRIPTION OF THE DRAWINGS

Reference is made to the accompanying drawings, in which.

DETAILED DESCRIPTION OF THE INVENTION

Figure 1:
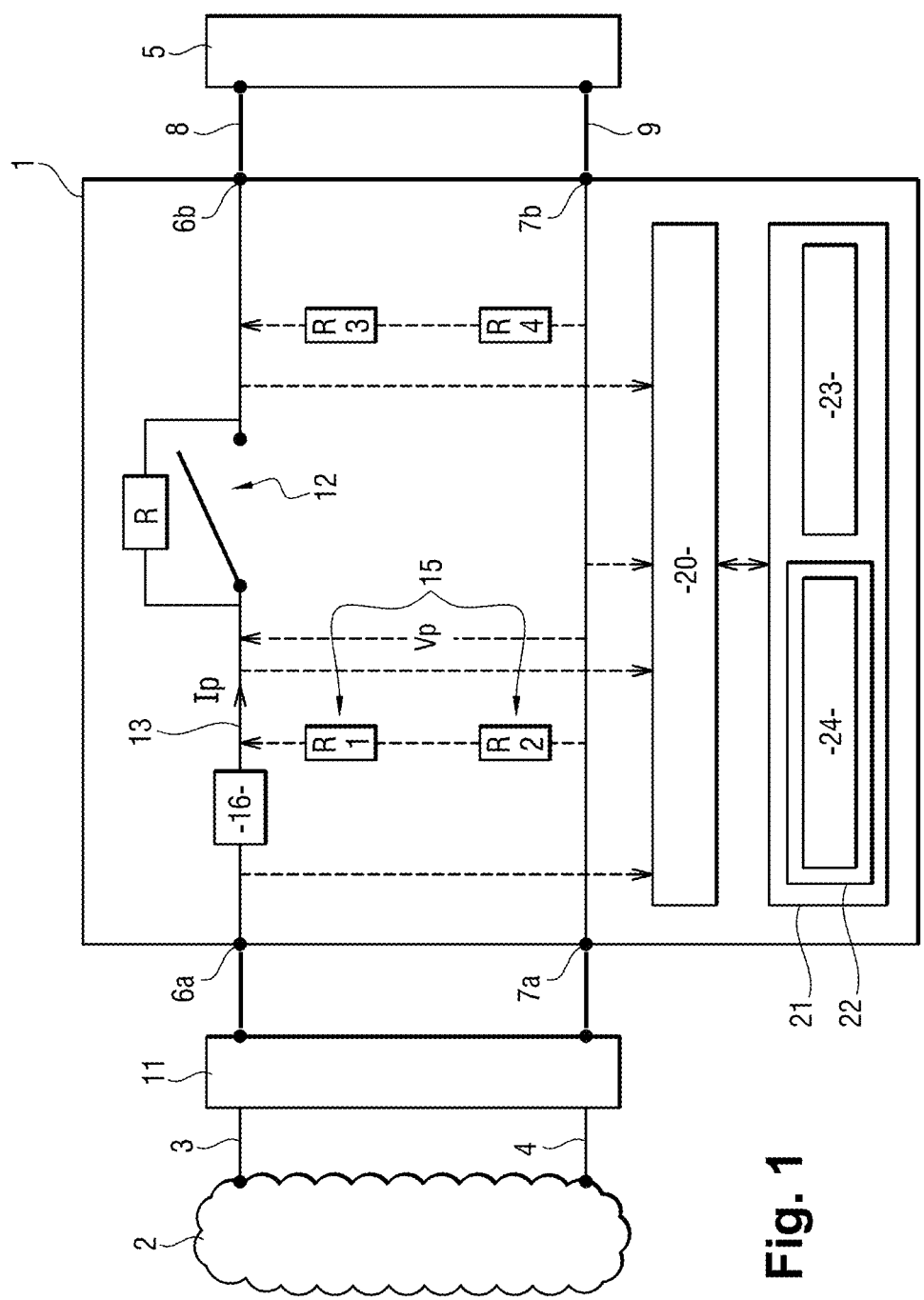
FIG. 1 shows a single phase electricity meter that performs a detection method in a first implementation of the invention.

With reference to FIG. 1, the method of detecting a sag in a phase voltage of an electricity network in a first implementation of the invention is performed in this example in a single phase electricity meter 1.

The electricity network 2 is a single phase electricity network, comprising a phase line 3 and a neutral line 4.

The meter 1 is for measuring the consumption of electrical energy supplied by the electricity network 2 to an electrical installation 5.

The meter 1 has an upstream phase terminal 6a, a downstream phase terminal 6b, an upstream neutral terminal 7a, and a downstream neutral terminal 7b.

The upstream phase terminal 6a is connected to the phase line 3 of the electricity network 2. The downstream phase terminal moral 6b is connected to a phase line 8 of the electrical installation 5. The upstream neutral terminal 7a is connected to the neutral line 4 of the electricity network 2. The downstream neutral terminal 7b is connected to a neutral line 9 of the electrical installation 5.

A disconnector 11 is positioned beside the electricity network 2 in order to be able to isolate the electrical installation 5 from the electricity network 2, whenever that is necessary.

The meter 1 also includes a cut-off member 12 connected in a phase conductor 13 of the meter 1. The phase conductor 13 is connected to the phase line 3 of the electricity network 2 when the meter 1 is connected to the electricity network 2. The cut-off member 12 is connected between the upstream phase terminal 6a and the downstream phase terminal 6b.

The cut-off member 12 enables action to be taken remotely to connect the electrical installation 5 to the electricity network 2, or to disconnect it therefrom.

The meter 1 also includes a phase voltage sensor 15 and a phase current sensor 16.

The phase voltage sensor 15 is represented symbolically by two resistors, although in reality it might well be more complicated.

In this example, the phase current sensor 16 is a shunt.

The phase voltage sensor 15 and the phase current sensor 16 are situated upstream from the cut-off member 12, i.e. on the side of the electricity network 2 relative to the cut-off member 12.

The phase voltage sensor 15 measures a phase voltage Vp that is equal to a potential difference between the phase line 3 and the potential of the neutral line 4 of the electricity network 2. In this example, the phase voltage Vp is an alternating voltage having a frequency equal to 50 hertz (Hz) and a root mean square (rms) voltage equal to 230 volts (V).

The phase current sensor 16 measures a phase current Ip conveyed by the phase conductor 13.

The phase voltage Vp and the phase current Ip supply power to the electrical installation 5.

The meter 1 also has a plurality of electrical components grouped together in a metrology functional block 20 and in an application functional block 21. The metrology functional block 20 and the application functional block 21 are separate and independent, such that a failure of one of these blocks does not lead to a failure of the other block.

The metrology functional block 20 acquires the measurements of the phase voltage Vp and the measurements of the phase current Ip, and it transmits them to the application functional block 21.

The application functional block 21 comprises processor means 22 and a memory 23.

The processor means 22 comprises a processor component 24 (e.g. a processor, a microcontroller, or a field programmable gate array (FPGA)) adapted to execute instructions of a program for performing the detection method. The processor component 24 performs other functions, and in particular it is adapted to manage the operation of the meter 1, to control of the cut-off member 12, and to process the measurements taken by the phase voltage sensor 15 and by the phase current sensor 16.

The memory 23 is a nonvolatile memory suitable for storing data to which the processor component 24 has access.

The detection method begins with measuring the phase voltage Vp and the phase current Ip at regular intervals upstream from the cut-off member 12.

The measurements are taken by the phase voltage sensor 15 and by the phase current sensor 16, and they are then acquired by the metrology functional block 20, and processed by the application functional block 21.

The measurements of the phase voltage Vp and of the phase current Ip are integrated over an integration duration. In this example, the integration duration is equal to 1 minute, however it could be different, and it need not necessarily be constant.

Integration makes it possible to obtain stabilized values for the phase voltage Vp and for the phase current Ip, without being subjected to the effects of transients between two levels of phase current Ip consumed by the electrical installation 5.

The duration of a regular interval corresponds to the normal and conventional sampling used for measuring the electrical energy consumed by the electrical installation 5. Likewise, the measurements of phase voltage Vp and of phase current Ip are also integrated in the context of measuring electrical energy. Performing the detection method therefore does not require any measurements to be taken in addition to the measurements that are necessary for the ordinary operation of the meter 1.

Thereafter, when the phase voltage Vp (in this example more precisely the rms value of the phase voltage Vp) becomes less than a predetermined voltage threshold, the detection method consists in opening the cut-off member 12.

In this example, the predetermined voltage threshold is equal to 160 V.

Once the cut-off member 12 has opened, if the phase voltage Vp returns to a normal voltage value, then the processor component 24 detects a malfunction of the meter 1. The processor component 24 then generates an alarm message for the information system (IS) in order to inform it about the malfunction of the meter 1. The processor component 24 keeps the cut-off member 12 open.

The alarm message is transmitted by powerline carrier or by any other (wired or wireless) type of communication means. When powerline carrier communication is selected, it is advantageous to use the device language message specification/companion specification for energy metering (DLMS/COSEM) application layers.

By way of example, the alarm message is as follows:
<EventNotificationRequest>
 <AttributeDescriptor>
  <ClassIdValue="0001"/>
  <InstanceIdValue="0000616200FF"/>
  <AttributeIdValue="02"/>
 </AttributeDescriptor>
 <AttributeValue>
  <DoubleLongUnsignedValue="00000001"/>
 </AttributeValue>
</EventNotificationRequest>

The encoding associated with the corresponding alarm is: C20000010000616200FF020600000001.

It should be observed that powerline carrier communication is managed by a communication component powered by the electricity network 2 from a point that is situated upstream from the cut-off member 12, and that the powerline currents are injected into the electricity network 2 from a point that is situated upstream from the cut-off member 12. Thus, it is possible to transmit the alarm message by powerline carrier currents even when the cut-off member 12 is open.

It should also be observed that detecting the malfunction of the meter 1 makes it possible to act in preventative manner against potential consequences of the malfunction. Specifically, if the malfunction is blackening of the cut-off member 12, that malfunction might cause a fire in the meter 1 or indeed in the electrical installation 5.

Once the cut-off member 12 has opened, if the phase voltage Vp remains below the predetermined voltage threshold, the processor component 24 detects a sag in the phase voltage Vp.

The processor component 24 then generates a warning message to inform that the phase voltage Vp has sagged, and it re-closes the cut-off member 12.

The above-mentioned normal voltage value is defined as a function of the phase current Ip.

Figure 2:
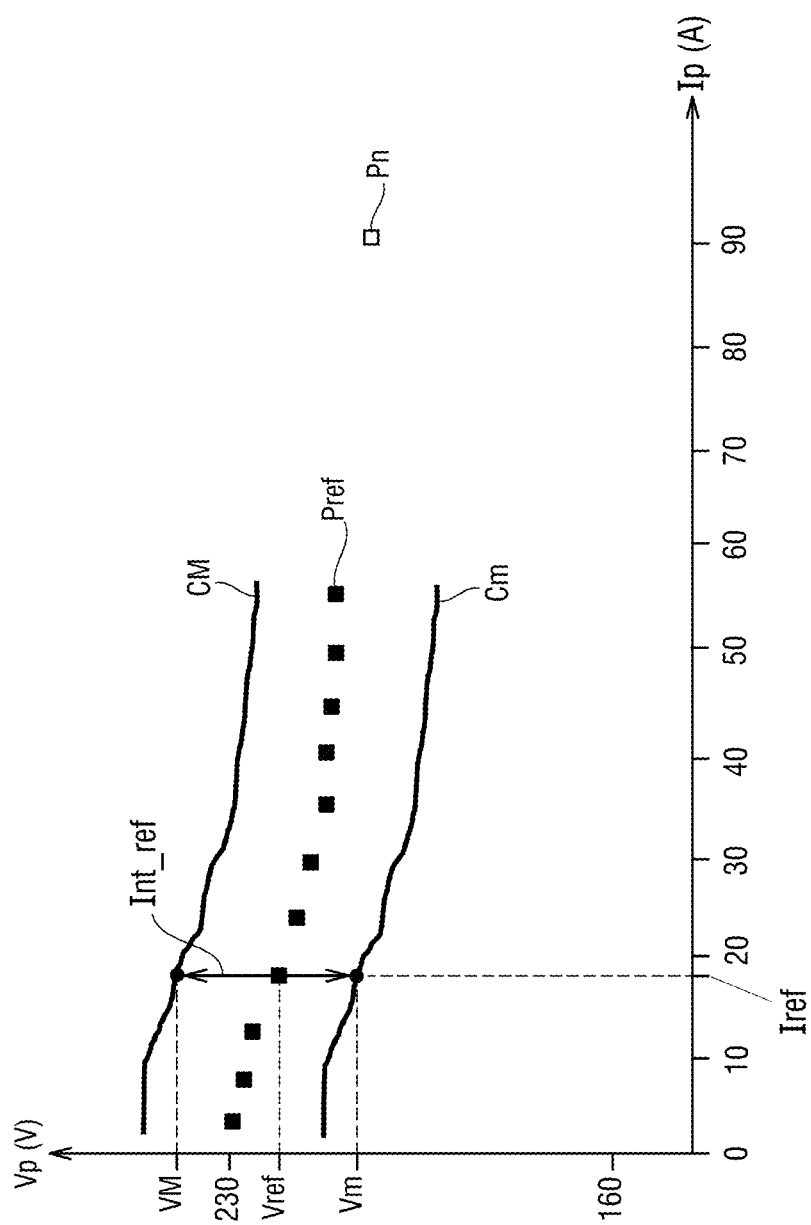
FIG. 2 is a graph plotting reference points, a curve of upper bounds of reference intervals, a curve of lower bounds of reference intervals, and a new point.

With reference to FIG. 2, the normal voltage value lies within a reference interval Int_ref about a reference voltage Vref. The reference voltage Vref depends on the phase current Ip.

A plurality of reference points Pref are thus defined in a plane defined by an abscissa axis and by an ordinate axis. The abscissa of each reference point Pref is a reference current value Iref, and its ordinate is a reference voltage value Vref.

For each reference voltage Vref, the reference interval has an upper bound constituted by a maximum voltage VM equal to the value of the reference voltage Vref plus 15%, and a lower bound constituted by a minimum voltage Vm equal to the value of the reference voltage Vref minus 15%.

The curve CM thus represents the maximum voltage VM as a function of the phase current Ip, while the curve Cm represents the minimum voltage Vm as a function of the phase current Ip.

Thus, for a value of the phase current Ip equal to a reference current Iref, the processor component 24 determines that the phase voltage Vp has returned to a normal voltage value if the phase voltage Vp lies in the reference interval Int_ref defined by: [Vref−15%; Vref+15%].

The reference points Pref are stored in a main table stored in the memory 23 of the application functional block 21. In this example, the main table has entries with granularity of 1 A for the phase current Ip.

Thus, after opening the cut-off member 12, and in order to determine whether the phase voltage has returned to a normal voltage value, the processor component 24 accesses the main table, identifies the value for the reference current Iref in the main table that corresponds to the phase current Ip as measured, and makes use of the reference voltage Vref that is associated in the main table with said reference current value Iref.

The detection method also includes a stage of automatically training the reference voltage Vref as a function of the phase current Ip. The purpose of the automatic training stage is to ensure the main table has entries that correspond to the phase voltages Vp and the phase currents Ip as actually measured by the meter 1. The phase voltages Vp and the phase currents Ip constituting entries in the main table are measured while the cut-off member 12 is closed, in the absence of any malfunction of the electricity meter, and in the absence of any sag in the phase voltage Vp.

For each new phase voltage Vp and each new phase current Ip as measured while the cut-off member 12 is closed, the automatic training stage consists initially in entering a new point Pn in a secondary table stored in the memory 23, which new point Pn is defined by the new phase voltage Vp and by the new phase current Ip.

Thereafter, when the phase current Ip takes a value for a reference current Iref of a reference point Pref (as already stored in the main table), if the corresponding phase voltage Vp lies within the reference interval Int_ref about the value for the reference voltage Vref of said reference point Pref, then the processor component 24 includes the new point Pn in the main table. The new point Pn, as defined by the new phase voltage Vp and by the new phase current Ip, then becomes a reference point Pref.

The automatic training stage, which makes use of the secondary table and of the concept of a "new point", is not performed immediately after the meter 1 is installed. During a preliminary stage of predetermined duration, equal in this example to one week, all of the new points Pn are included directly in the main table.

It should be observed that various situations can arise at the beginning of the detection method, i.e. after the cut-off member 12 has been opened, and while the processor component 24 is attempting to determine whether the phase voltage Vp has returned to a normal voltage value, and for this purpose is attempting to identify the value in the main table of the reference current Iref that corresponds to the measured phase current Ip.

The simplest situation is when the main table does indeed contain a value for the reference current Iref that is equal to the phase current Ip (to within no more than ±1 A, given that the 1 A granularity of the main table).

Nevertheless, it is possible that the main table does not yet contain a value for the reference current Iref that is equal to the phase current Ip (to within ±1 A).

If the closest value for the reference current Iref differs from the phase current Ip by an absolute value that is less than or equal to a predetermined current difference, then linear interpolation is used to estimate the reference voltage Vref that is to be used.

In contrast, if the closest value for the reference current Iref differs from the phase current Ip by an absolute value that is greater than a predetermined current difference, then the detection method re-closes the cut-off member 12 and keeps it closed.

In this example, the predetermined current difference is equal to 5 A.

Figure 3:
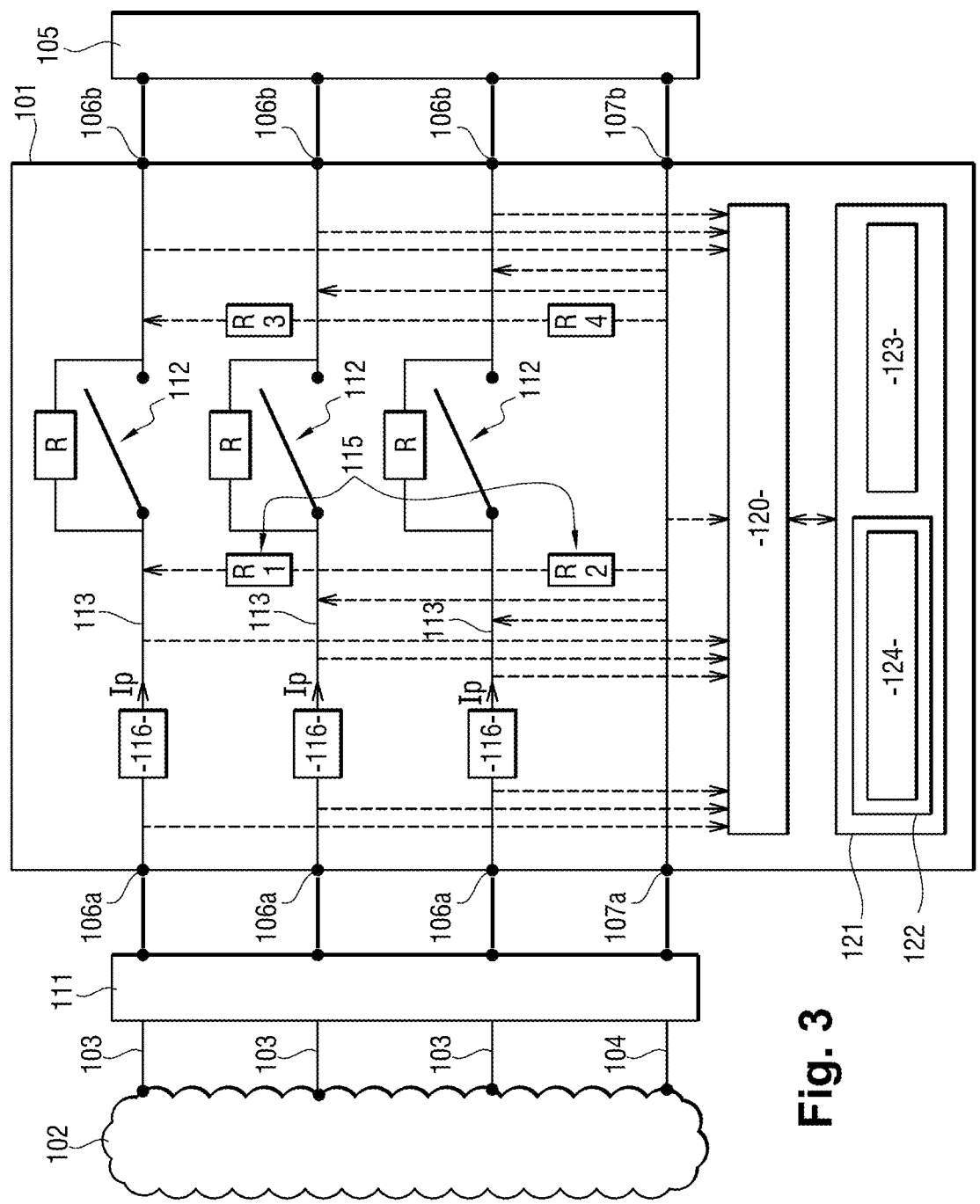
FIG. 3 shows a three-phase electricity meter that performs a detection method in a second implementation of the invention.

With reference to FIG. 3, the method of detecting a sag in a phase voltage of an electricity network in a second implementation of the invention is performed in this example in a three-phase electricity meter 101.

The electricity network 102 is a three-phase electricity network comprising three phase lines 103 and one neutral line 104.

The meter 101 is for measuring the consumption of electrical energy supplied by the electricity network 102 to an electrical installation 105.

The meter 1 has three upstream phase terminals 106a, three downstream phase terminals 106b, an upstream neutral terminal 107a, and a downstream neutral terminal 107b.

The meter 101 further comprises three cut-off members 112, each connected in the phase conductor 113 of a respective one of the phase lines 103.

The meter 1 further comprises respective phase voltage sensors 115 for each of the phase lines (the three phase voltage sensors 115 are represented symbolically by only two resistors in FIG. 3, in order to make FIG. 3 more readable), together with one phase current sensor 116 for each of the phases. The phase current sensors 116 are toruses.

The meter 101 also has a plurality of electrical components grouped together in a metrology functional block 120 and in an application functional block 121.

The application functional block 121 comprises processor means 122 and a memory 123.

The processor means 122 comprise a processor component 124.

The detection method in the second implementation consists in performing the above-described detection method of the first implementation in independent manner for each of the phases 103.

Use is thus made of one main table per phase and of one secondary table per phase.

A phase sag can thus potentially be detected for each of the phase lines 103, and an automatic training stage can be performed for each of the phase lines 103.

Naturally, the invention is not limited to the embodiments described, but covers any variant coming within the ambit of the invention as defined by the claims.

All of the numerical values provided herein are used to illustrate the invention, and they could naturally be different when performing the invention.

It is also possible for the electrical architecture of the single phase meter and of the three-phase meter to be different. Naturally, the components used could be different. In particular, it is possible to use different voltage sensors and different current sensors.

The invention naturally applies to any multiphase meter (and to any multiphase electricity network).

The invention claimed is:

1. A detection method for detecting a sag of a phase voltage present on a phase line of an electricity network, the detection method being performed by an electricity meter that is connected to the electricity network and that includes a cut-off member inserted in a phase conductor connected to the phase line, the detection method comprising the following steps:
   measuring, upstream from the cut-off member and at regular intervals, the phase voltage and a phase current conveyed by the phase conductor;
   when the phase voltage becomes less than a predetermined voltage threshold, opening the cut-off member;
   after opening the cut-off member, measuring the phase voltage; if the phase voltage returns to a normal voltage value defined as a function of the phase current, detecting a malfunction of the electricity meter, generating an alarm message to inform about the malfunction of the electricity meter, and keeping the cut-off member open;
   after opening the cut-off member, measuring the phase voltage; if the phase voltage remains less than the predetermined voltage threshold, detecting a sag of the phase voltage, generating a warning message informing about the sag of the phase voltage, and re-closing the cut-off member.

2. The detection method according to claim 1, wherein the normal voltage value lies in a reference interval about a reference voltage that depends on the phase current.

3. The detection method according to claim 2, wherein the reference voltage comes from a main table stored in a memory of the electricity meter, said main table comprising a plurality of reference points, each defined by a value for the reference voltage and by a value for the reference current.

4. The detection method according to claim 3, further comprising an automatic training stage for training the reference voltage as a function of the phase current.

5. The detection method according to claim 4, wherein the automatic training stage comprises the following steps:
   in the absence of a malfunction of the electricity meter and in the absence of a sag of the phase voltage, measuring a new phase voltage and a new phase current while the cut-off member is closed;
   entering a new point in a secondary table, the new point being defined by the new phase voltage and by the new phase current;
   thereafter, when the phase current takes a value for the reference current of a reference point, if the associated phase voltage lies in the reference interval about the value of the reference voltage for said reference point, entering the new point in the main table, the new point then becoming a reference point.

6. The detection method according to claim 5, wherein during a preliminary stage of predetermined duration, all of the new points are inserted directly into the main table.

7. The detection method according to claim 5, further detecting the sag of at least one phase voltage of a multi-phase electricity network in independent manner for each phase.

8. The detection method according to claim 1, wherein the malfunction of the electricity meter that is detected is blackening of the cut-off member.

9. An electricity meter including a cut-off member, a voltage sensor, a current sensor, and a processor component arranged to perform a detection method for detecting a sag of a phase voltage present on a phase line of an electricity network, wherein the electricity meter is connected to the electricity network and the cut-off member is inserted in a phase conductor of the electricity meter connected to the phase line, the detection method comprising the following steps performed by the processor component:
   using the voltage sensor and the current sensor to measuring, upstream from the cut-off member and at regular intervals, the phase voltage and a phase current conveyed by the phase conductor;
   when the phase voltage becomes less than a predetermined voltage threshold, opening the cut-off member;
   after opening the cut-off member, measuring the phase voltage; if the phase voltage returns to a normal voltage value defined as a function of the phase current, detecting a malfunction of the electricity meter, generating an alarm message to inform about the malfunction of the electricity meter, and keeping the cut-off member open;
   after opening the cut-off member, measuring the phase voltage; if the phase voltage remains less than the predetermined voltage threshold, detecting a sag of the phase voltage, generating a warning message informing about the sag of the phase voltage, and re-closing the cut-off member.

10. A non-transitory computer storage medium comprising instruction executed by a processor for enabling an electricity meter to perform a detection method for detecting a sag of a phase voltage present on a phase line of an electricity network, wherein the electricity meter is connected to the electricity network and includes a cut-off member inserted in a phase conductor connected to the phase line, the detection method comprising the following steps:
   measuring, upstream from the cut-off member and at regular intervals, the phase voltage and a phase current conveyed by the phase conductor;
   when the phase voltage becomes less than a predetermined voltage threshold, opening the cut-off member;

after opening the cut-off member, measuring the phase voltage; if the phase voltage returns to a normal voltage value defined as a function of the phase current, detecting a malfunction of the electricity meter, generating an alarm message to inform about the malfunction of the electricity meter, and keeping the cut-off member open;

after opening the cut-off member, measuring the phase voltage; if the phase voltage remains less than the predetermined voltage threshold, detecting a sag of the phase voltage, generating a warning message informing about the sag of the phase voltage, and re-closing the cut-off member.

* * * * *